(12) United States Patent
Leong et al.

(10) Patent No.: US 9,035,713 B2
(45) Date of Patent: May 19, 2015

(54) CONDUCTOR WINDING AND INDUCTORS ARRANGED TO FORM A BALUN HAVING A FIGURE EIGHT SHAPE

(71) Applicant: Marvell World Trade Ltd., St. Michael (BB)

(72) Inventors: Poh Boon Leong, Singapore (SG); Hou Xian Loo, Singapore (SG)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

(21) Appl. No.: 14/339,976

(22) Filed: Jul. 24, 2014

(65) Prior Publication Data

US 2014/0333387 A1  Nov. 13, 2014

Related U.S. Application Data

(63) Continuation of application No. 13/846,183, filed on Mar. 18, 2013, now Pat. No. 8,791,769, which is a continuation of application No. 13/332,200, filed on Dec. 20, 2011, now Pat. No. 8,400,232.

(60) Provisional application No. 61/426,969, filed on Dec. 23, 2010.

(51) Int. Cl.
*H03H 7/42* (2006.01)
*H01P 5/10* (2006.01)
*H01Q 1/50* (2006.01)
*H03H 5/00* (2006.01)

(52) U.S. Cl.
CPC .. *H03H 7/42* (2013.01); *H01P 5/10* (2013.01); *H01Q 1/50* (2013.01)

(58) Field of Classification Search
CPC .............. H03H 5/00; H03H 7/42; H01F 27/28
USPC ........................... 333/25, 26, 4; 336/200, 226
See application file for complete search history.

(56) References Cited

U.S. PATENT DOCUMENTS

| 4,816,784 | A | 3/1989 | Rabjohn | |
| 7,129,784 | B2 * | 10/2006 | Bhatti et al. | 330/295 |
| 7,164,339 | B2 | 1/2007 | Huang | |
| 7,332,960 | B2 | 2/2008 | Burns et al. | |
| 7,369,096 | B2 * | 5/2008 | Castaneda et al. | 343/859 |
| 8,054,155 | B2 | 11/2011 | Raczkowski | |

(Continued)

FOREIGN PATENT DOCUMENTS

| FR | 2862158 A1 | 5/2005 |
| JP | 2008198929 A | 8/2008 |
| WO | WO-2009144211 A1 | 12/2009 |

OTHER PUBLICATIONS

Organized Translation of Notice of Reasons for Rejection for Japanese Patent Application No. 2013-545530 dated Aug. 26, 2014, 3 pages.
Itoh, Nobuyuki, et al. "Twisted Inductor VCO for Supressing On-chip Interferences." Proceedings of Asia-Pacific Microwave Conference 2007: 4 pages. Print.

(Continued)

*Primary Examiner* — Dean Takaoka

(57) ABSTRACT

A balun including a first conductor winding, a first inductor, a second inductor, a third inductor, and a fourth inductor. The first conductor winding has a figure eight shape including a first loop and a second loop. The first inductor and the second inductor substantially surround the first loop. The third inductor and the fourth inductor substantially surround the second loop.

16 Claims, 5 Drawing Sheets

(56) References Cited

U.S. PATENT DOCUMENTS

| | | | |
|---|---|---|---|
| 8,183,971 B2* | 5/2012 | Le Guillou et al. | 336/200 |
| 8,269,575 B2 | 9/2012 | Frye et al. | |
| 8,319,593 B2* | 11/2012 | Ke | 336/145 |
| 8,400,232 B2* | 3/2013 | Leong et al. | 333/25 |
| 8,427,388 B2* | 4/2013 | Fahs et al. | 343/859 |
| 8,791,769 B2* | 7/2014 | Leong et al. | 333/25 |
| 2004/0182602 A1 | 9/2004 | Satoh et al. | |
| 2014/0077919 A1* | 3/2014 | Godoy et al. | 336/220 |

OTHER PUBLICATIONS

Neihart, Nathan, et al. "Twisted Inductors for Low Coupling Mixed-Signal and RF Applications." IEEE 2008 Custom Intergrated Circuits Conference (CICC) (2008): 575-578. Print.

Poon, Andrew, et al. "Reduction of Inductive Crosstalk Using Quadrupole Inductors." IEEE Journal of Solid-State Circuits 44.6 (Jun. 2009): 1756-1764. Print.

International Search Report and Written Opinion from International Application No. PCT/IB2011/003262 filed Dec. 20, 2011.

* cited by examiner

CONDUCTOR WINDING AND INDUCTORS ARRANGED TO FORM A BALUN HAVING A FIGURE EIGHT SHAPE

CROSS-REFERENCE TO RELATED APPLICATIONS

The present disclosure is a continuation of U.S. patent application Ser. No. 13/846,183 (now U.S. Pat. No. 8,791,769), filed on Mar. 18, 2013, which is a continuation of U.S. patent application Ser. No. 13/332,200 (now U.S. Pat. No. 8,400,232), filed on Dec. 20, 2011, which claims the benefit of U.S. Provisional Application No. 61/426,969, filed on Dec. 23, 2010. The entire disclosures of the applications referenced above are incorporated herein by reference.

BACKGROUND

Unless otherwise indicated herein, the approaches described in the background section of the instant application are not prior art to the claims in the application and are not admitted to be prior art by inclusion in the background section.

Baluns are electrical transformers that convert electrical signals that are balanced about ground to electrical signals that are unbalanced about ground. Baluns may also convert electrical signals that are unbalanced about ground and convert the electrical signals to being balanced about ground.

A balun typically includes two inductors where each inductor is formed from a set of wound conductors. The sets of wound conductors are inductively coupled if current is passed through one set of wound conductors. FIG. 1 is a simplified schematic of a traditional balun 100. Balun 100 includes a first set of wound conductors 105 and a second set of wound conductors 110. One wound conductor from each set of wound conductors 105 and 110 is shown in FIG. 1 for simplification. Each wound conductor in the set of wound conductors 105 may be adjacent to a wound conductor in the set of wound conductors 110. Traditional baluns typically tend to introduce a relatively large amount of cross talk (i.e., interference) with nearby circuits, such as other inductors, other baluns, and the like.

Therefore, it would be desirable to provide new baluns having relatively lower cross talk than traditional baluns and having smaller areas than traditional baluns while providing the same efficiency.

SUMMARY

Embodiments described herein generally relate to baluns, and more particularly relate to a balun having a figure 8 shape, which provide for equivalent power transfer compared to a traditional balun and provides such power transfer in relatively less area than a traditional balun.

According to one embodiment, a balun includes a first set of wound conductors includes a first loop portion and a second loop portion. The first loop portion and the second loop portion are conductively coupled and form a first figure eight structure. The balun further includes a second set of wound conductors includes a third loop portion and a fourth loop portion. The third loop portion and the fourth loop portion are conductively coupled and form a second figure eight structure. The first loop portion and the third loop portion are inductively coupled. The second loop portion and the fourth loop portion are inductively coupled.

According to a specific embodiment, the first set of wound conductors includes a set of conductive cross portions disposed between the first loop portion and the second loop portion and conductively links the first loop portion and the second loop portion.

According to another specific embodiment, the second set of wound conductors includes another set of conductive cross portions disposed between the third loop portion and the fourth loop portion and conductively links the third loop portion and the fourth loop portion.

According to another specific embodiment, the first set of wound conductors includes a set of conductive un-crossing portions disposed between the first loop portion and the second loop portion and conductively links the first loop portion and the second loop portion.

According to another specific embodiment, the second set of wound conductors includes another set of conductive un-crossing portions disposed between the third loop portion and the fourth loop portion and conductively links the third loop portion and the fourth loop portion.

According to another specific embodiment, the first set of wound conductors are stacked above the second set of wound conductors.

According to another specific embodiment, the wound conductors of the first set of wound conductors are interleaved with the wound conductors of the second set of wound conductors.

According to another specific embodiment, the wound conductors of the first set of wound conductors are stacked and interleaved with the wound conductors of the second set of wound conductors.

According to another specific embodiment, a number of wound conductors in the first set of wound conductors does not match a number of wound conductors in the second set of wound conductors.

According to another specific embodiment, the balun further includes another balun disposed in the first and the third loop portions; and another balun disposed in the send and the fourth loop portions.

According to another specific embodiment, the first, the second, the third, and the fourth loop portions are substantially round.

According to another specific embodiment, the first, the second, the third, and the fourth loop portions are substantially oval.

According to another specific embodiment, the first, the second, the third, and the fourth loop portions are substantially rectangular.

According to another specific embodiment, the first, the second, the third, and the fourth loop portions each include substantially linear portions. According to another embodiment, a balun method of operation includes directing current in a first set of wound conductors forming a first figure eight structure, and inducing a current in a second set of wound conductors forming a second first eight from the current directed through the first set of wound conductors. The method further includes establishing from the current directed through the first set of wound conductors a first magnetic field in a first loop portion of the first figure eight structure of the first set of wound conductors. The method further includes establishing from the current directed through the first set of wound conductors a second magnetic field in a second loop portion of the first figure eight structure of the first set of wound conductors; wherein the first magnetic field and the second magnetic field are oppositely directed.

According to a specific embodiment, the method further includes canceling portions of the first magnetic field with portions of the second magnetic field outside of the first set of wound conductors.

According to a specific embodiment, the method further includes establishing from the induced current directed through the second set of wound conductors a third magnetic field in a third loop portion of the second figure eight structure of the second set of wound conductors. The method further includes establishing from the induced current directed through the second set of wound conductors a fourth magnetic field in a third loop portion of the second figure eight structure of the second set of wound conductors. Third magnetic field and the fourth magnetic field are oppositely directed.

According to a specific embodiment, the method further includes canceling portions of the third magnetic field with portions of the fourth magnetic field outside of the second set of wound conductors.

According to a specific embodiment, the method further includes inhibiting cross talk with adjacent circuit structures via the first cancellation step and the second cancellation step.

According to another embodiment, a fully-differential power amplifier includes a first power amplifier core including first and second inductors having an output AC signal directed across the first and the second inductors, and a second power amplifier core including third and fourth inductors having the output AC signal directed across the third and the fourth inductors. The fully-differential power amplifier further includes a balun including a set of wound conductors having a first loop portion and a second loop portion conductive coupled to the first loop portion. The first loop portion and the second loop portion form a figure eight structure. The first loop portion is configured to inductively couple the first and the second inductors to the balun. The second loop portion is configured to inductively couple the third and the forth inductors to the balun.

According to a specific embodiment, the fully-differential power amplifier further includes an antenna coupled to the balun and configured to receive the AC signal from the balun for transmission. The fully-differential power amplifier may also include an antenna coupled to the balun and configured to receive the AC signal from the balun for transmission.

The following detailed description and accompanying drawings provide a more detailed understanding of the nature and advantages of the present invention.

DESCRIPTION

Embodiments described herein generally provide to baluns, and more particularly provide a balun having a FIG. 8 shape, which provide for equivalent power transfer compared to a traditional balun and provides such power transfer in relatively less area than a traditional balun.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 2A:
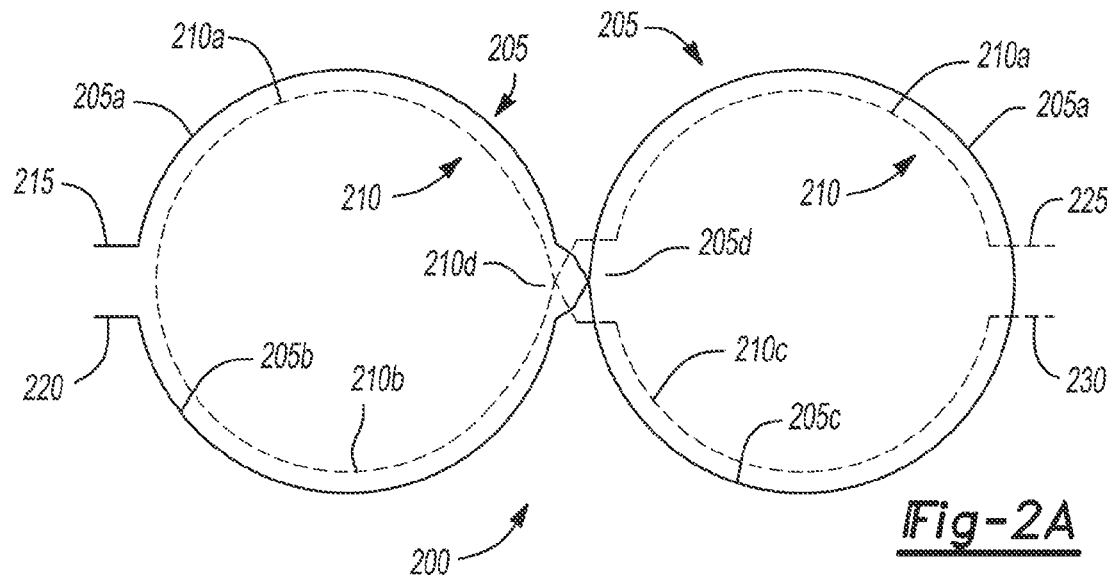
FIG. 2A is a simplified schematic of a balun according to one embodiment.

FIG. 2A is a simplified schematic of a balun 200 according to one embodiment. Balun 200 includes a first set of wound conductors 205 and a second set of wound conductors 210. For simplicity, one wound conductor 205a (shown as a solid line in FIG. 2A) from the first set of wound conductors 205 is shown in FIG. 2A, and one wound conductor 210a (shown as a dashed line in FIG. 2A) from the second set of wound conductors 210 is shown in FIG. 2A. The first set of wound conductors 205 may include an input node 215 and an output node 220. The second set of wound conductors 210 may include an input node 225 and an output node 230.

The following description of balun 200 describes wound conductor 205a included in the set of wound conductors 205 and describes wound conductor 210a included in the set of wound conductors 210. The following description of wound conductor 205a and wound conductor 210a may apply to each of the wound conductors included the sets of wound conductors 205 and 210. Specifically, wound conductor 205a may include a first loop 205b conductively coupled to a second loop 205c where the first loop 205b and the second loop 205c are adjacent. First loop 205b and second loop 205c may cross over each other in a central portion 205d of wound conductor 205a. Thereby, first loop 205b and second loop 205c may form substantially a "figure eight" structure. Wound conductor 210a may similarly include a first loop 210b conductively coupled to a second loop 210c. First loop 210b and second loop 210c may cross over each other in a central portion 210d of wound conductor 210a. Thereby, first loop 210b and second loop 210c may form substantially a "figure eight" structure. The central portions 205d and 210d may be laterally offset so that the crossing portions of the wound conductor 205a and 210a shown in FIG. 2A may cross at different locations. The crossing portions of the wound conductor 205a and 210a may be stacked or interleaved according to alternative embodiments. According to an alternative embodiment, the centrals portion 205d of the first loop 205*b* and second loop 205*c* do not cross, and the central portion 210*d* of the first loop 210*b* and the second loop 210*c* do not cross.

For convenience, first loop 205*b* is shown in FIG. 2A as being outside of first loop 210*b*, and second loop 205*c* is shown as being outside of second loop 210*c*. The first loops 205*b* and 210*b*, and the second loops 205*c* and 210*c* may be alternatively configured with first loop 205*b* overlying first loop 210*b* and second loop 205*c* overlying second loop 210*c*.

According to one embodiment, the set of wound conductors 205 are stacked above the set of wound conductors 210. Stacked sets of wound conductors 205 and 210 provide relatively low insertion loss and relatively high inductive coupling. According to an alternative embodiment, the wound conductors of the set of wound conductors 205 and the wound conductors of the set of wound conductors 210 interleave one another. Interleaved wound conductors provide relatively low secondary resonances due to the capacitance provided by the parasitic capacitance between the sets of wound conductors. Secondary resonances are lower order harmonics and higher order harmonics of the fundamental harmonic (i.e., fundamental frequency) of an AC signal received by balun 200. Stacked sets of wound conductors 205 and 210 may have relatively higher secondary resonances across cross capacitor 260 at relatively high frequencies. According to one embodiment, the sets of wound conductors 205 and 210 are both stacked and interleaved. Stacking and interleaving the sets of wound conductors 205 and 210 provides for a tradeoff between insertion losses and the generation of secondary resonances.

Figure 1:
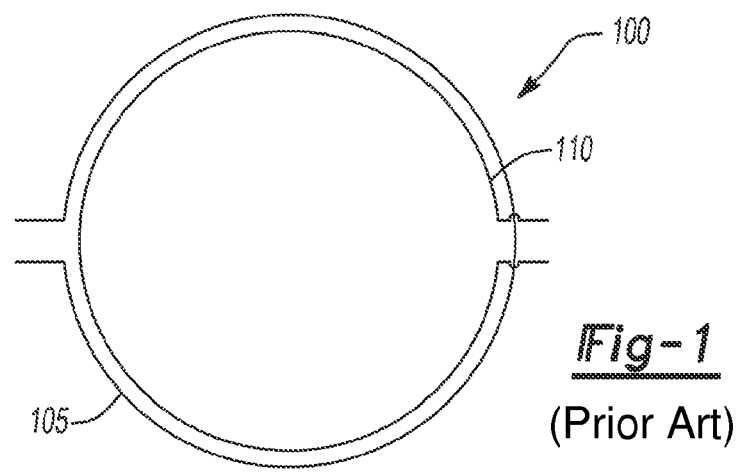
FIG. 1 is a simplified schematic of a traditional balun.
Figure 2B:
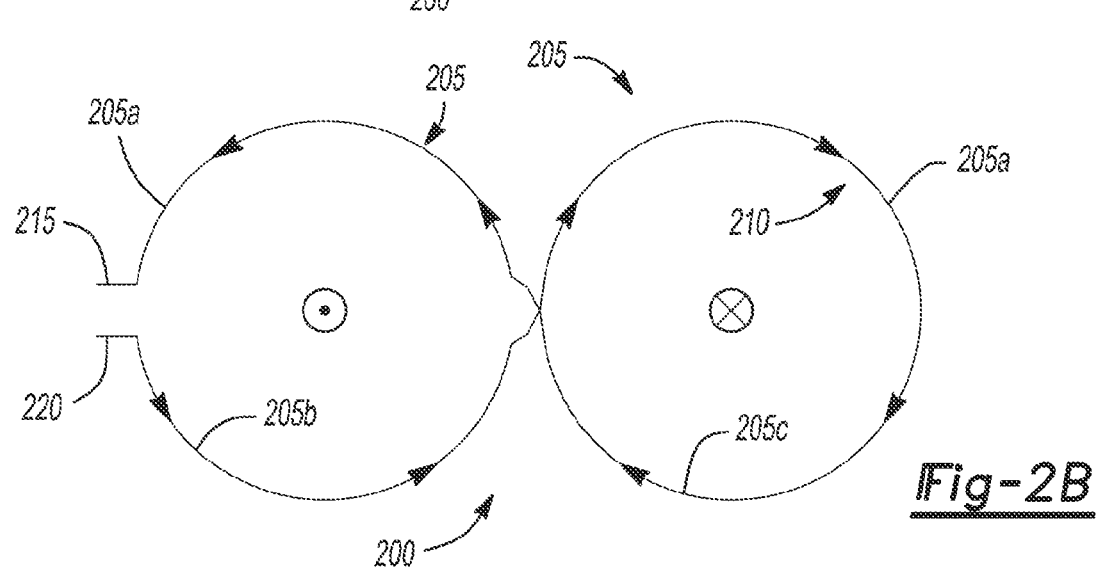
FIG. 2B is a simplified schematic of magnetic fields established by a first loop and a second loop of the first set of wound conductors where the magnetic fields in the first and the second loops are in opposite directions.

FIG. 2B is a simplified schematic of magnetic fields established by first loop 205*b* and second loop 205*c* wherein the magnetic fields in the first and the second loops 205*b* and 205*c* are in opposite direction. The first and the second loops 210*b* and 210*c* are not shown in FIG. 2B for convenience. For example, for a first direction of current flow in the set of wound conductors 205, the direction of the magnetic field in first loop 205*b* may be out of the plane of the page of FIG. 2B (conventionally designated with a dot inside a circle "⊙" as shown in FIG. 2B), and the direction of the magnetic field in second loop 205*c* may be into the plane of the page of FIG. 2 (conventionally designated with a cross inside a circle "⊗" as shown in FIG. 2B). As will be understood by those of skill in the art, the magnetic fields extending outside of first loops 205*a* and 210*a* will also be in the opposite direction of magnetic fields extending outside of second loops 205*b* and 210*b*. Because the magnetic fields established by first loop 205*b* is oppositely directed from the magnetic fields established by second loop 205*c*, the magnetic fields extending from balun 200 tend to cancel each other. The cancellation of the oppositely directed magnetic fields provides that the magnetic fields have a relatively reduced potential for inducing cross talk (i.e., interference) in adjacent circuits structures, such as inductors, other balun, and the like. For example, compared to a traditional balun, such as balun 100 shown in FIG. 1, balun 200 may provide a gain of approximately 30 *d* B of isolation from an adjacent circuit structure, such as another balun. While FIG. 2B shows the magnetic fields for the first loop 205*b* and the second loop 205*c*, the magnetic fields for first loop 210*b* and the second loop 210*c* are similar, but oppositely directed for the direction of current flow as shown in FIG. 2B.

Balun 200 further provides an inductance that matches the inductance of a traditional balun while having a smaller area. For example, balun 200 may provide an inductance that substantially matches the inductance of a traditional balun while having an area that is approximately 1.6 times to 1.7 times less than the area of a traditional balun. Therefore, for an application such as an integrated circuit, balun 200 may consume considerably less die area than a traditional balun.

Figure 3A:
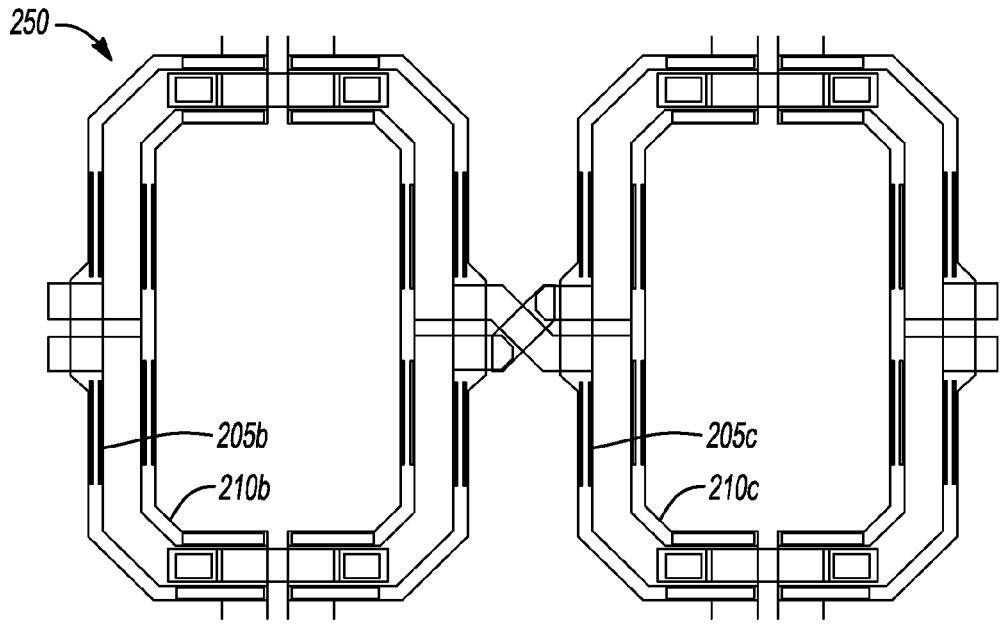
FIG. 3A is a simplified schematic of a balun according to an alternative embodiment where loops of the balun are substantially oval.
Figure 3B:
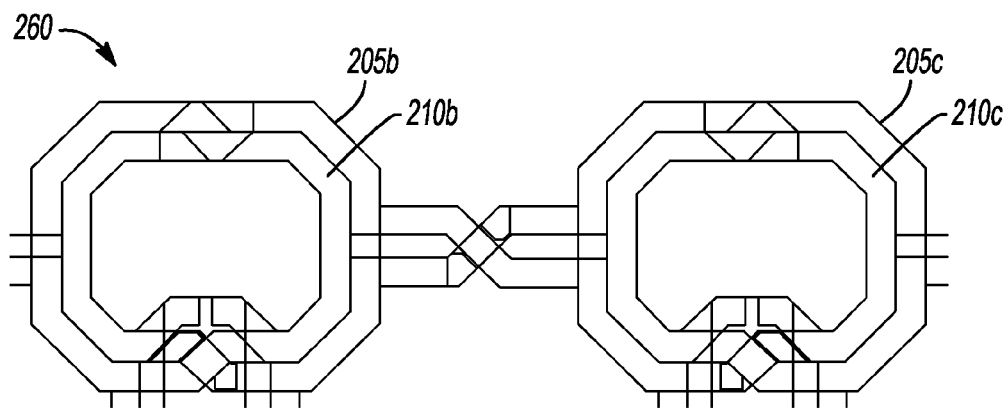
FIG. 3B is a simplified schematic of a balun according to an alternative embodiment where loops of the balun are substantially rectangular.
Figure 3C:
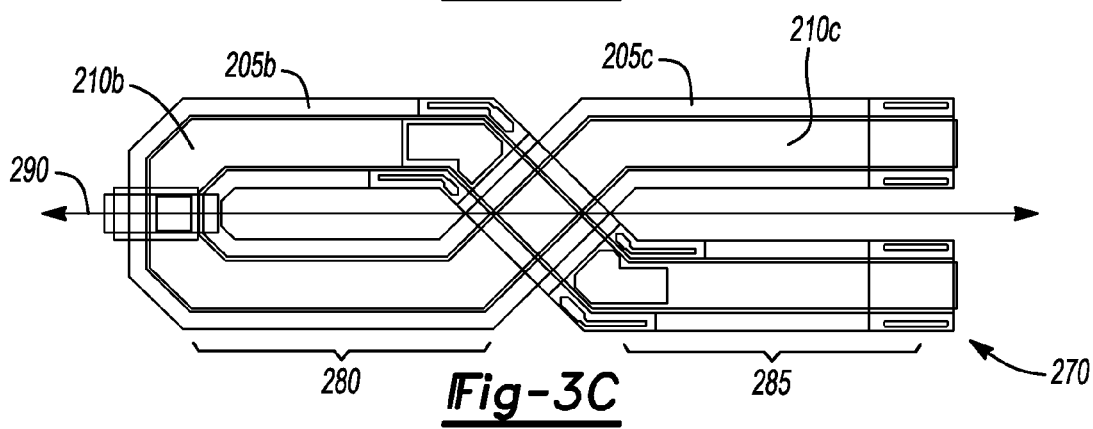
FIG. 3C is a simplified schematic of a balun according to another alternative embodiment where one set of loops of the balun have substantially straight lines portions and along an extended axis of the balun.

While first loops 205*b* and 210*b*, and second loops 205*c* and 210*c* are shown in FIG. 2 as being substantially circular, the first loops and second loops of the sets of wound conductors 205 and 210 may be alternatively shaped according to alternative embodiments. FIG. 3A is a simplified schematic of a balun 250 according to an alternative embodiment where first loops 205*b* and 210*b*, and second loops 205*c* and 210*c* are substantially oval. FIG. 3B is a simplified schematic of a balun 260 according to an alternative embodiment where first loops 205*b* and 210*b*, and second loops 205*c* and 210*c* are substantially oval. It is noted that the elongated axes of the oval shaped loops shown in FIG. 3A are rotated approximately ninety degrees from the elongated axes of the oval shaped loops shown in FIG. 3B. FIG. 3C is a simplified schematic of a balun 270 according to another alternative embodiment where first loops 205*b* and 210*b*, and second loops 205*c* and 210*c* have substantially straight lines portions 280 and 285 along an extended axis 290 of balun 270. While balun 200 is described as including sets of wound conductors 205 and 210 in a FIG. 8, alternative balun embodiments may include more sets of wound conductors coupled to the set of wound conductors 205 or the set of wound conductors 210. Such a balun may look like three, four, or more sets of adjacent wound-conductor loops that are conductive coupled. According to various embodiments described herein, the number of wound conductors in the first set of wound conductors 205 may match the number of wound conductors in the second set of wound conductors 210. Alternatively, the number of wound conductors in the first set of wound conductors 205 may be different than the number of wound conductors in the second set of wound conductors 210.

Figure 4:
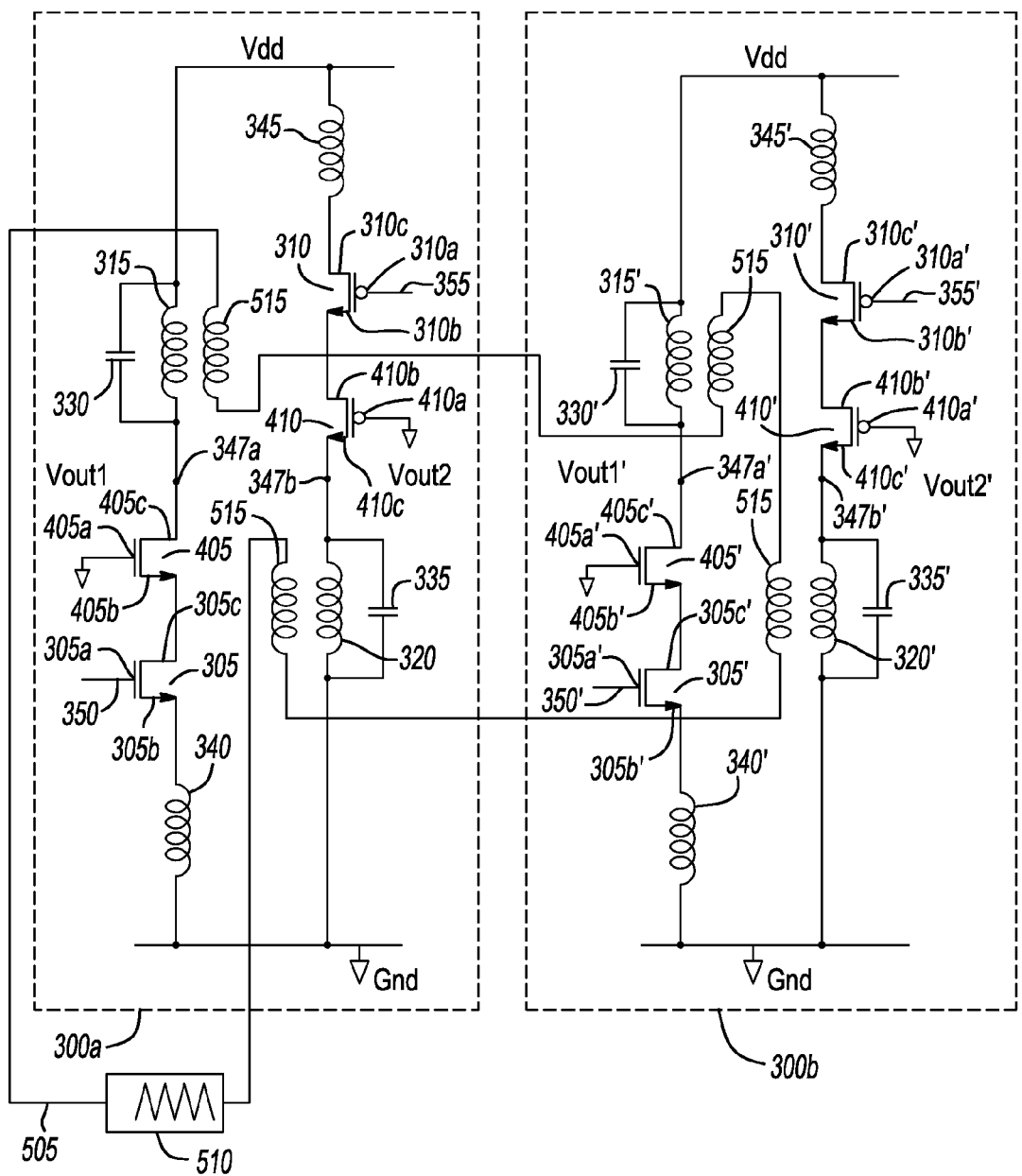
FIG. 4 is a simplified schematic of a fully-differential power amplifier in which balun embodiments described herein is configured for use in a coupler for coupling an AC output of the fully-differential amplifier to an antenna.

FIG. 4 is a simplified schematic of a fully-differential power amplifier 500 inductively coupled to a coupler 505, which includes a set of inductors 515. Coupled 505 may be configured to inductively coupled the output of the fully-differential power amplifier 500 to an antenna 510. Balun embodiments described herein may be configured for inclusion in coupler 505 and first-fully differential amplifier 500 for inductively coupling coupler 505 to fully-differential power amplifier 500 as will be described in further detail below. Power amplifiers, such as fully-differential power amplifier 500, are generally configured to receive an AC signal, such as an RF signal, and boost the power of the received AC signal. Fully-differential power amplifiers may be included in a variety of mobile devices, such as mobile telephones, computers (such as laptop computers, tablet computers, etc.), personal digital assistants, and the like. A power-amplified AC signal may be directed through an antenna of a mobile device for transmission.

Fully-differential power amplifier 500 includes a first power-amplifier core 300*a* (generally surrounded by a dashed line in FIG. 4) and a second power-amplifier core 300*b* (also generally surrounded by a dashed line in FIG. 4). The same numbering system used for identifying circuit elements of first power-amplifier core 300*a* is used for identifying the substantially same circuit elements of second power-amplifier core 300*b* where numbers used for second power-amplifier core 300*b* are primed. The first and second power-amplifier cores 300*a* and 300*b* have substantially similar circuits and have substantially similar circuit layouts. Therefore, the first power-amplifier core 300*a* is described in detail, and the second power-amplifier core 300*b* is not described. The description of the first power-amplifier core 300*a* applies the second power-amplifier core 300*b*.

First power-amplifier core 300a includes a push-pull pair of transistors 305 and 310, (referred to as transistors 305 and 310). First power-amplifier core 300a further includes a transistor 405 disposed between transistor 305 and a first inductor 315, and includes a transistor 410 disposed between transistor 310 and a second inductor 320. Transistors 405 and 410 are sometimes referred to herein as a second push-pull pair of transistors.

Transistors 305 and 405 may be in a cascode configuration with a, respective, common source, common ground configuration. More specifically a source 405b of transistor 405 may be coupled to the drain 305c of transistor 305, and a drain 405c of transistor 405 may be coupled to the first end of first inductor 315 where the second end of first inductor 315 is coupled to the voltage source Vdd. A gate 405a of transistor 405 may be grounded or the like to relatively strongly turn on transistor 405.

Transistors 310 and 410 may similarly be in a cascode configuration with a, respective, common source, common ground configuration. More specifically a source 410b of transistor 410 may be coupled to the drain 310b of transistor 310, and a drain 410c of transistor 410 may be coupled to the first end of second inductor 320 where the second end of inductor 320 is coupled to ground. A gate 410a of transistor 410 may be grounded or the like to relatively strongly turn on transistor 410. The cascode configuration of the transistors provide for stress protection of power amplifier 400 as will be well understood by those of skill in the art. According to one embodiment, the gates 305a and 310a are first and second inputs 350 and 355 of fully-differential power amplifier 500.

First power-amplifier core 300a may also include first and second tank capacitors 330 and 335. Capacitor 330 is coupled to inductor 315 in parallel (i.e., in a "tank" configuration). Tank capacitor 330 is configured to tune the resonant frequency of inductor 315. Tank capacitor 335 is coupled to inductor 320 in a tank configuration. Tank capacitor 335 is configured to tune the resonant frequency of inductor 320.

Transistors 305, 310, 405, and 310 may be metal-oxide-semiconductor field-effect transistors (MOSFETs), bipolar-junction transistors (BJTs), or other transistors types. According to one embodiment, transistors 305 and 405 are nMOS transistors where transistor 405 has a drain 405c (sometimes referred to a drain region) coupled to a first end of inductor 315 where a second end of inductor 315 is coupled to a voltage source Vdd. A first output node (Vout1) 347a is disposed between drain 405c and the first end of inductor 315. A source 305b of transistor 305 may be coupled to a first end of a third inductor 340 where a second end of the third inductor 340 is coupled to ground. Specific configurations of the sources and the drains of transistors 305, 310, 405, and 410 are described herein for convenience of explanation of specific embodiments. Alternative embodiments of the power amplifiers may include alternative configurations of the sources and drains of transistors 305 and 310 as will be understood by those of skill in the art. As will be further understood by those of skill in the art, sources and drains are sometimes referred to herein as source-drain nodes.

According to one embodiment, transistors 310 and 410 are pMOS transistors where transistor 410 includes a drain 410c coupled a first end of inductor 320 where a second end of inductor 320 is coupled to ground. A second output node (Vout2) 347b is disposed between source 410c and the first end of inductor 320. A source 310c of transistor 310 is coupled to a first end of a fourth inductor 345 where a second end of fourth inductor 345 is coupled to the voltage source Vdd. Inductors 315 and 320 may be considered the respective loads of the push-pull pair of transistors 305 and 310.

As described briefly above, coupler 505, via the set of inductors 515, is configured to inductively couple an output AC signals across inductors 315, 320, 315', and 320' to antenna 510. For convenience, coupler 505 is shown as including the set of inductors 515 as a simplification for indicating the inductive coupling of the output AC signal across inductors 315, 320, 315', and 320' to antenna 510. As described briefly above, balun embodiments described herein may be configured to inductively couple the AC output signals across inductors 315, 320, 315', and 320' to antenna 510.

Figure 5:
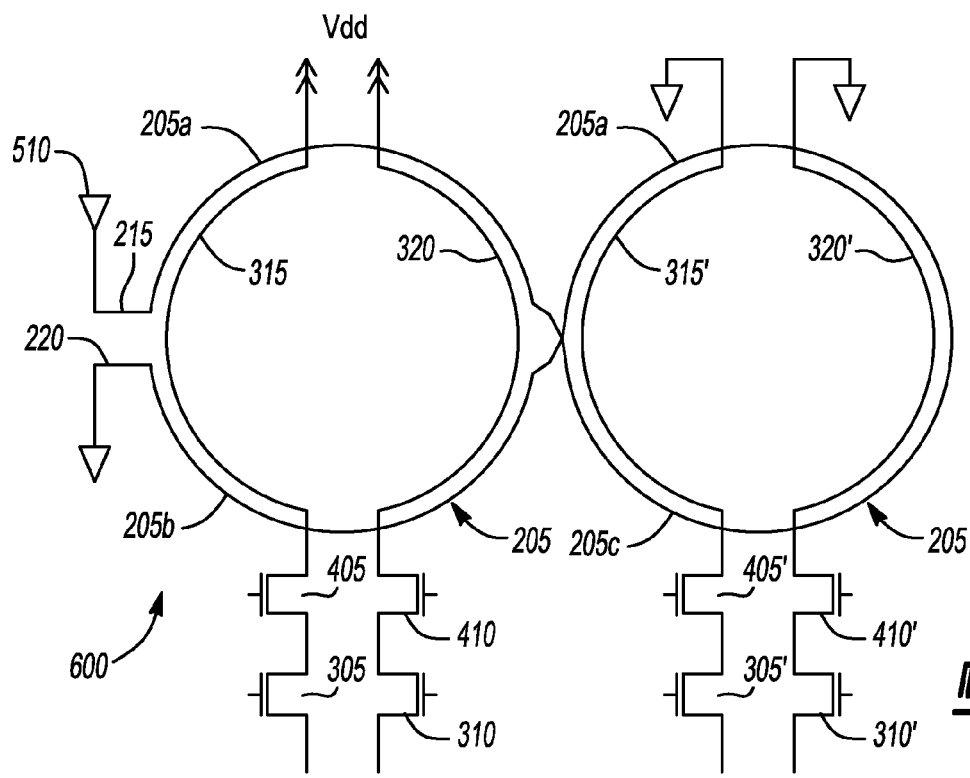
FIG. 5 is a simplified schematic of a balun configured to inductively couple output AC signals of a fully-differential power amplifier, such as that shown in FIG. 5, to an antenna according to one embodiment.

FIG. 5 is a simplified schematic of a balun 600 configured to inductively couple the output AC signals of fully-differential power amplifier 500 to antenna 510 according to one embodiment. Balun 600 includes the first set of wound conductors 205 where the first loop 205b is inductively coupled to inductors 315 and 320, and the second loop 205c is inductively coupled to inductors 315' and 320'. Inductors 315 and 320 may be curved to conform to the loop shape of the first loop 205b, and inductors 315' and 320' may be curved to conform to a looped shape of the second loop 205c such that inductors 315 and 320, 315', and 320' form a substantially figure eight shape similar to the figure eight shape of the first set of wound conductors 205. Balun 600 may include inductors 315, 320, 315', and 320'. The first set of wound conductors 205 may inductively coupled the AC output signal across inductors 315, 320, 315', and 320' to antenna 510 for transmission of the AC output signal.

Figure 6:
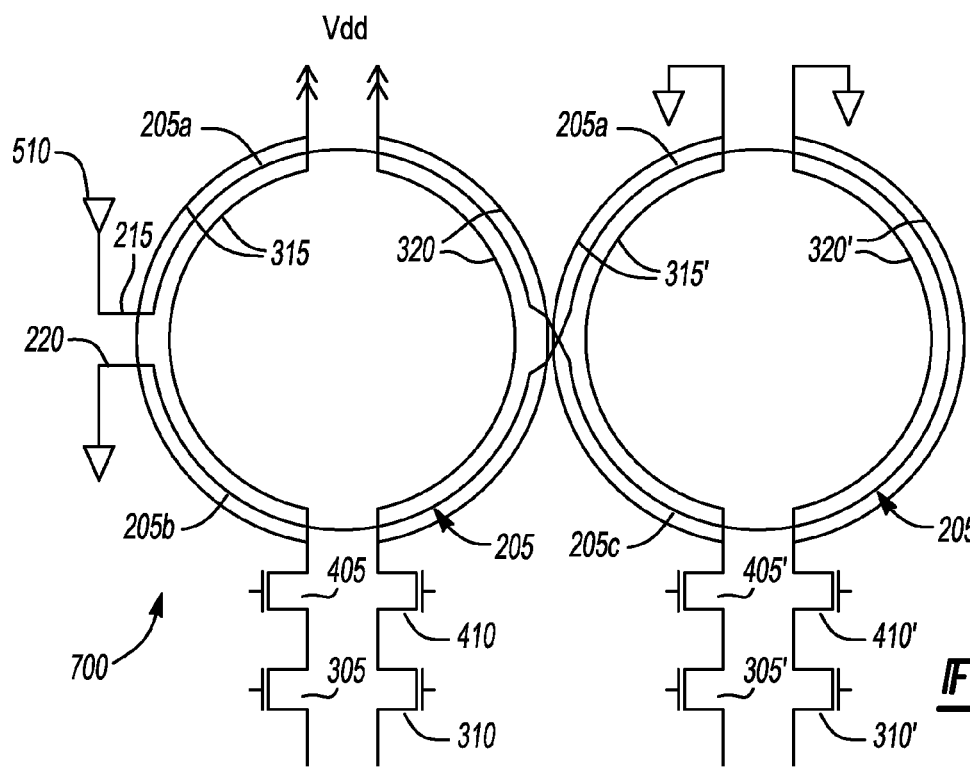
FIG. 6 is a simplified schematic of balun where inductors substantially surround portions of the first loop and the second loop of the balun to reduce mechanical forces on the balun due to the interacting magnetic fields of the balun.

According to one embodiment, inductors 315, 320, 315', and 320' may be shaped to substantially surround portions of the first loop 205b and the second loop 205c. FIG. 6 is a simplified schematic of balun 700 where inductors 315, 320, 315', and 320' substantially surround portions of the first loop 205b and the second loop 205c.

Figure 7:
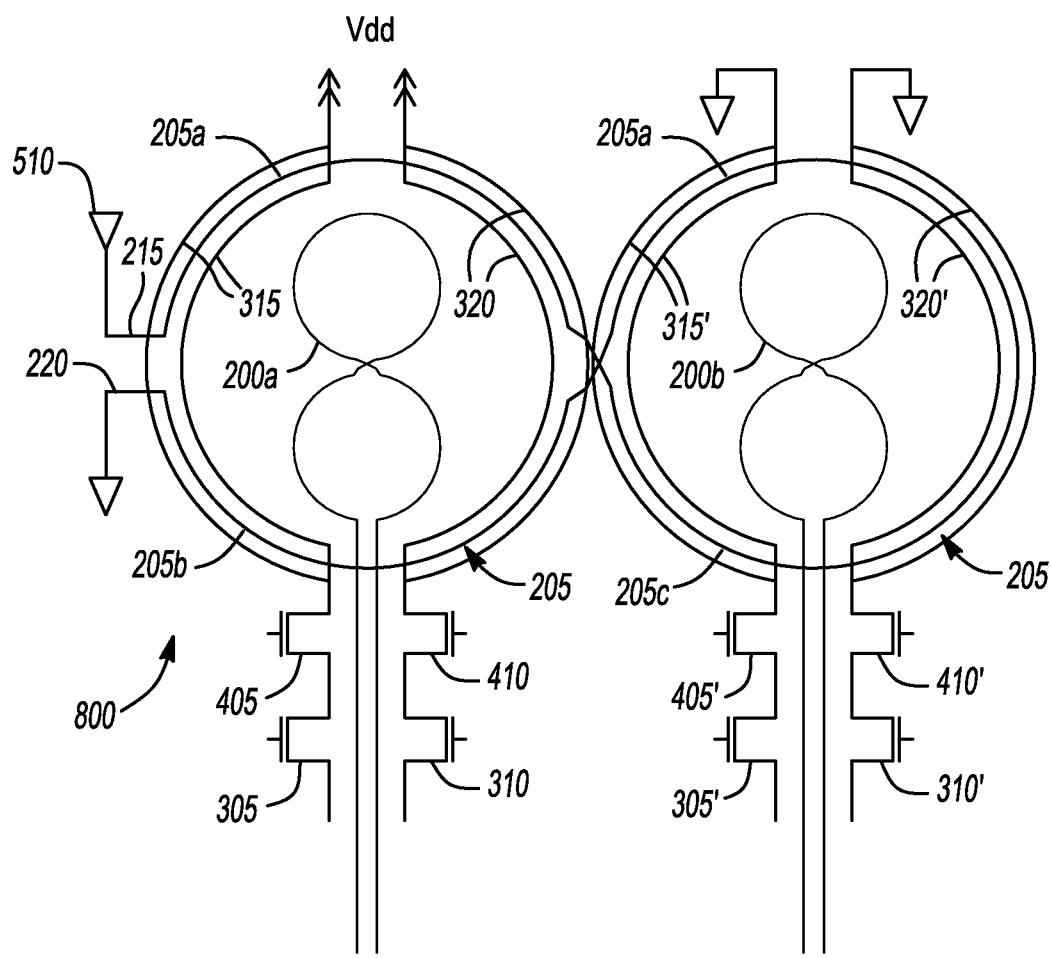
FIG. 7 is a simplified schematic of balun according to another embodiment.

FIG. 7 is a simplified schematic of balun 800 according to another embodiment. Balun 800 is substantially similar to balun 600 and balun 700 described above, but differs in that balun 800 includes an additional first balun 200a and/or an additional second balun 200b where baluns 200a and 200b may be disposed in the first loop 205b and the second loop 205c. "Nesting" balun according to embodiments of the present invention may efficiently use space for these balun in an integrated circuit or the like. Balun 200a and 200b may each be a balun 200 described above or may be other balun embodiments described herein. Balun 200a and 200b may be configured for inductively coupling other circuit structures, such as a set of input inductors of fully-differential power amplifier 500. While inductors 315' and 320' are shown in FIGS. 5, 6, and 7 as being coupled to ground, according to alternative embodiments, inductors 315' and 320' may be coupled to an AC ground.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations, and equivalents may be employed without departing from the scope of the invention as defined by the claims.

What is claimed is:
1. A balun, comprising:
 a first conductor winding having a figure eight shape, wherein the figure eight shape of the first conductor winding includes a first loop and a second loop;
 a first inductor;

a second inductor, wherein the first inductor and the second inductor substantially surround the first loop;

a third inductor; and a fourth inductor, wherein the third inductor and the fourth inductor substantially surround the second loop.

2. The balun of claim 1, wherein the first inductor and the second inductor are curved to conform to a shape of the first loop.

3. The balun of claim 1, wherein the third inductor and the fourth inductor are curved to conform to a shape of the second loop.

4. The balun of claim 1, wherein the first inductor and the second inductor are inductively coupled to the first loop.

5. The balun of claim 1, wherein the third inductor and the fourth inductor are inductively coupled to the second loop.

6. The balun of claim 1, wherein the first inductor and the second inductor are coupled to a supply voltage.

7. The balun of claim 1, wherein the third inductor and the fourth inductor are coupled to ground.

8. The balun of claim 1, wherein:
the first loop and the second loop are not concentric.

9. The balun of claim 1, wherein:
the first loop and a third loop formed by the first inductor and the second inductor are concentric.

10. The balun of claim 1, wherein:
the second loop and a fourth loop formed by the third inductor and the fourth inductor are concentric.

11. The balun of claim 1, further comprising a second conductor winding having a figure eight shape, wherein the figure eight shape of the second conductor includes a third loop and a fourth loop each surrounded by i) the first loop, or ii) the second loop.

12. The balun of claim 1, wherein: the first conductor winding includes a first input node and a first output node, wherein the first conductor winding is configured to receive current via the first input node and output current via the first output node to cause i) a first magnetic field to flow in a first direction in the first loop, and ii) a second magnetic field to flow in a second direction in the second loop.

13. The balun of claim 1, wherein the first loop and the second loop are substantially round, substantially oval, or substantially rectangular.

14. A power amplifier comprising the balun of claim 1.

15. The power amplifier of claim 14, further comprising an antenna configured to receive an AC signal from the balun.

16. A cellular phone comprising the power amplifier of claim 14.

* * * * *